United States Patent [19]

Sterling et al.

[11] 4,317,175

[45] Feb. 23, 1982

[54] DYNAMIC RATE INTEGRATING DEMAND MONITOR

[75] Inventors: Thomas L. Sterling, Belmont; James L. Kirtley, Jr., Brookline, both of Mass.

[73] Assignee: Massachusetts Institute of Technology, Cambridge, Mass.

[21] Appl. No.: 93,429

[22] Filed: Nov. 13, 1979

[51] Int. Cl.³ ............................................. G01R 11/57
[52] U.S. Cl. ................................ 364/464; 324/103 R; 340/870.11; 364/483
[58] Field of Search ............... 364/483, 464, 492, 900; 340/151, 150, 178; 235/432, 92 E, 92 L; 324/103 R, 113

[56] References Cited

U.S. PATENT DOCUMENTS

| | | | |
|---|---|---|---|
| 4,035,772 | 7/1977 | Abe et al. | 340/150 |
| 4,080,568 | 3/1978 | Funk | 364/464 |
| 4,106,095 | 8/1978 | Yarbrough | 364/464 |
| 4,120,031 | 10/1978 | Kincheloe et al. | 235/432 |
| 4,125,782 | 11/1978 | Pollnow, Jr. | 364/900 |
| 4,162,530 | 7/1979 | Kusui et al. | 364/464 |

Primary Examiner—Errol A. Krass
Attorney, Agent, or Firm—Arthur A. Smith, Jr.; Gary A. Walpert

[57] ABSTRACT

A dynamic rate integrating demand monitor which measures electric power to a customer load at closely-spaced time intervals and prices that load at each such interval on the basis of a predetermined set of factors.

9 Claims, 8 Drawing Figures

DYNAMIC RATE INTEGRATING DEMAND MONITOR

The present invention relates to monitors that relate user cost not only to the amount of a product used but to a further set of factors.

Attention is called to an application for Letters Patent entitled "Frequency Adaptive Power-Energy Re-Scheduler" (Schweppe), Ser. No. 076,019, filed Sept. 17, 1979. In the Schweppe application, there is introduced a new concept of load control for modulating, at the user end, loading on an electric power system. While the demand monitor of the present system is not in any way restricted to use in the context of the re-scheduler disclosed in the Schweppe application, it does find particular value in that context. Attention is also called to a paper of the present inventors entitled "Impact of New Electronic Technologies to the Customer End of Distribution Automation and Control" (Kirtley et al.).

Spot pricing is a way to allow the price of a unit of electric power delivered to a user load to reflect the overall economic value of that unit, i.e., the cost of delivering the unit at the particular time of delivery. The concept implicit in spot pricing is that the price varies with time, increasing as system load increases to reflect the fact that relatively expensive generation must be used at peak system load. It is expected that price variations will prompt customers to re-schedule some uses of electric power away from time of peak system load. Spot pricing as used herein differs from the action of time-of-day rates now in use in that the spot price varies to reflect actual instantaneous system and load conditions. Toward that end, it is an object of the present invention to provide a dynamic rate integrating demand monitor (DRIDM) which can accept information, directly or through measurement, concerning instantaneous power system status and customer load behavior in order to determine the instantaneous electrical power unit price to be charged to the customer.

In the Schweppe patent application, there is disclosed a frequency adaptive power-energy re-scheduler (FAPER) which is capable of controlling delivery of electric energy to a load on the basis of actual instantaneous system and load conditions. It is another object to provide a dynamic rate integrating demand monitor that is particularly well suited for use in the context of the system disclosed in the Schweppe patent application.

Still another object is to provide information to the customer regarding power system status, customer energy demand, and current energy unit price. This information is provided in two forms. Visual remote indicators are coupled to DRIDM to allow customers to read the stated information. The information is also available to automatic customer energy management system via a digital communication data link such as IEEE 488, RS 232, or some other perhaps yet to be defined intra-building data link.

A further object of the present invention is to provide a system to act as the interface between the power system and the customer in a microshedding environment for emergency-state control. In this capacity, the DRIDM acts as surrogate for the power company to determine mandatory customer demand reduction under load shedding conditions and to monitor customer response. It must further control an automatic breaker at the supply terminals to the customer.

A still further object is to provide the mechanism for automatic polling by the power company of accrued energy consumption and charges.

These and still further objects are addressed hereinafter.

The foregoing objects are achieved, generally, in a dynamic rate integrating demand monitor (DRIDM) that includes, in combination, means for measuring electric power delivered to a customer load for each instant of time (i.e., predetermined, short, successive time intervals), means for determining an appropriate price for the power thus delivered at each said instant of time on the basis of actual instantaneous conditions of the system delivering the power to the load, and means for recording total usage of electric power, in units of money. In addition, interface hardware and communications protocol software are incorporated to facilitate data transfer between the DRIDM and power company and between the DRIDM and customer related systems.

The invention is hereinafter described with referece to tha accompanying drawing in which.

Figure 1:
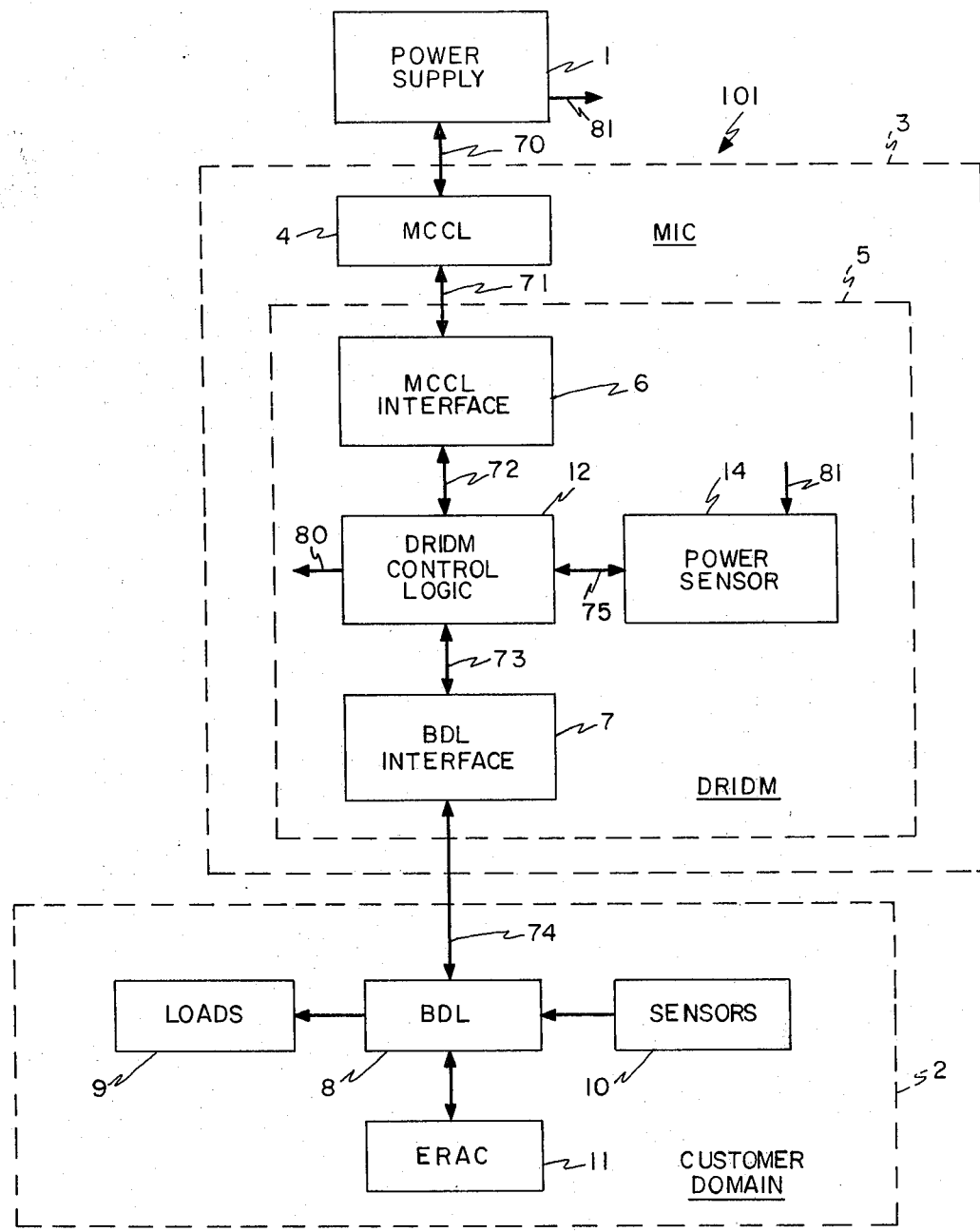
FIG. 1 shows an electric power system in block diagram form and including a dynamic rate integrating demand monitor (DRIDM) of the present invention.

Referring to FIG. 1, an electric power system is shown at 101. The system 101 includes an electrical power supply 1 which for present purposes is intended to denote generation, transmission and, in general, all those aspects of a power system whch has to do with delivery of electric energy to a customer. The blocks labeled 2 and 3 represent respectively a customer control and a communication system, as now discussed.

The block 3 (which is called marketing interface to customer, MIC herein) contains a data communication system (MCCL) 4 which receives and transmits information between the power utility company (i.e., the supply 1) and the customer. Any of three types of communication may be used: power line carrier, telephone wires, and radio, with the possibility of optical fibers as they develop. The data communication system 4 transmits pricing and other data to the customer, as later discussed. Within the block 3 is a dynamic rate integrating demand monitor (DRIDM) 5 of the present invention. The monitor 5 is a very smart electronic power meter with communication interfacing, MCCL interface 6 and BDL interface 7 which provide communication interfaces respectively with the MCCL 4 and a customer domain block 2. The block 2 contains electrical loads 9, sensors 10 and the customer energy resource allocation controller (ERAC) 11. Communications within the block 2 and from the block 2 to the monitor 5 are through a building data link 8. The controller 11 may, but does not have to, include one or more freuency adaptive, power-energy reschedulers of the type described in the Schweppe patent application, which function to control flow of electrical energy to the loads 9 as a function of deviations in the frequency of the power supply 1. The sensors 19 serve to determine the proper operation of the controller 11. For purposes herein, it is merely necessary to know that electrical energy and data pass from the block 3 to the block 2 and the data pass from the block 2 to the block 3, as later discussed. The remainder of the description is concerned mostly with the elements in the block 5, the dynamic rate integrating demand monitor.

Figure 4:
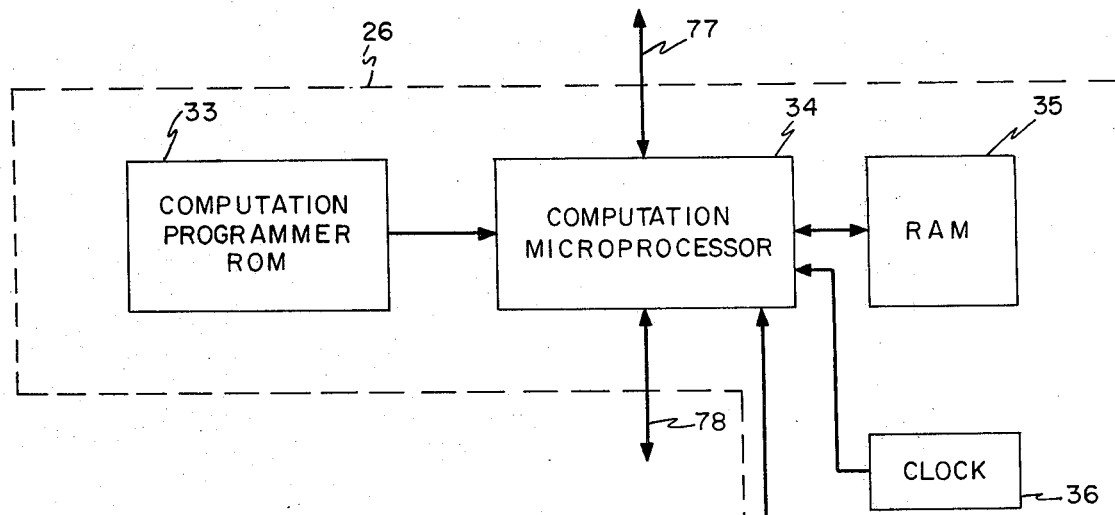
FIG. 4 shows a block diagram form the computation subsystem of FIG. 2, which subsystem includes a computation microprocessor.

The center of the monitor 5 is DRIDM control logic 12 which is programmed in accordance with a rate algorithm, later discussed, to accept load level information from a power sensor 14 and pricing information from the interface 6; it passes both pieces of information to a cost integrator (e.g., a summer in the RAM labeled 35 in FIG. 4) which integrates the cost for a predetermined instant of time (i.e., small time interval). Frequency information is developed in blocks 12 and 14, as later discussed, for the controller 11 for purposes discussed in the Schweppe patent application; but the system frequency may also be one of the factors considered in arriving at customer cost. The ramifications of DRIDM are addressed in detail in the Kirtley et al. paper and need not be repeated here, it being merely repeated that the function of the monitor 5 is to place upon each customer a properly assessable cost occasioned by the energy use of that customer and to furnish to that customer sufficient information to permit the customer to minimize total costs by controlling electric energy usage over predetermined small time intervals. The remainder of this description is directed primarily to a detailed description, to the extent necessary, of the functioning elements in the block 5 of FIG. 1.

Figure 2:
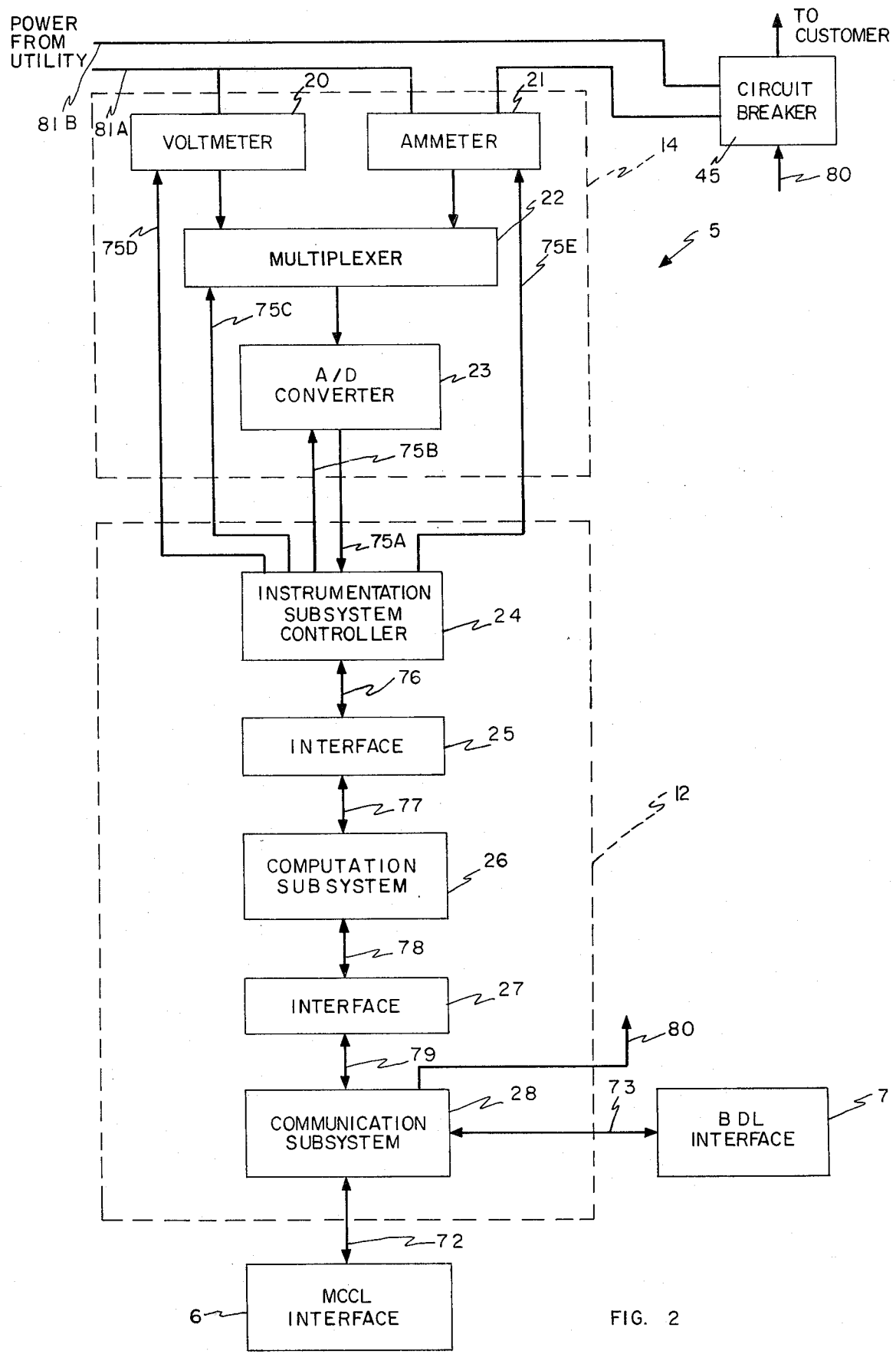
FIG. 2 shows, in block diagram form, one form the DRIDM of FIG. 1 can take and includes, among other things, an instrumentation subsystem, a computation subsystem and a communication subsystem.

In FIG. 1, the information paths connecting interacting circuit elements have applied thereto numbers 70–75 and 80; the line labeled 81 is a power link. FIG. 2 contains further information or communication links 76–79. Not all the information paths are mentioned further in this text, their function being mostly to correlate later, more detailed figures, with FIG. 1 (or FIG. 2). Also, in the later figures where the single path of FIG. 1 is shown to be a plurality of paths, more complete designations are added; for example, the path marked 75 in FIG. 1 is shown, in fact, to consist of paths 75A, 75B, 75C, 75D and 75E in FIG. 2. Also, whereas the paths 75B, 75C, 75D and 75E are single paths to carry control signals from the logic 12 respectively to an A/D converter 23, an analog multiplexer 22, a voltmeter 20 and an ammeter 21, the path 75A is a multilead unit (here twelve leads) to carry digital data from the A/D converter 23 to the logic 12. The same convention on the matter of paths is carried forth in FIG. 2 and later figures.

Figure 3:
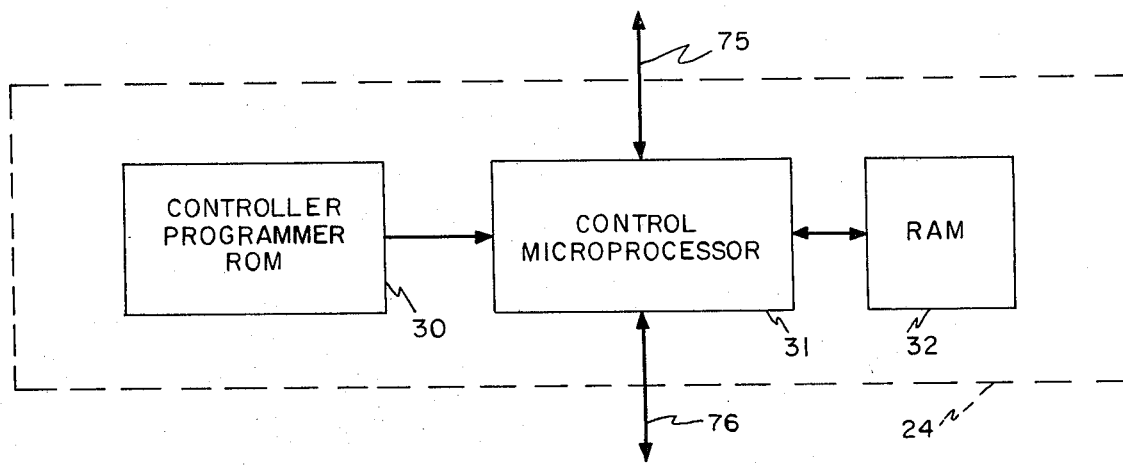
FIG. 3 shows in block diagram form the instrumentation subsystem of FIG. 2, which subsystem includes a control microprocessor.
Figure 5:
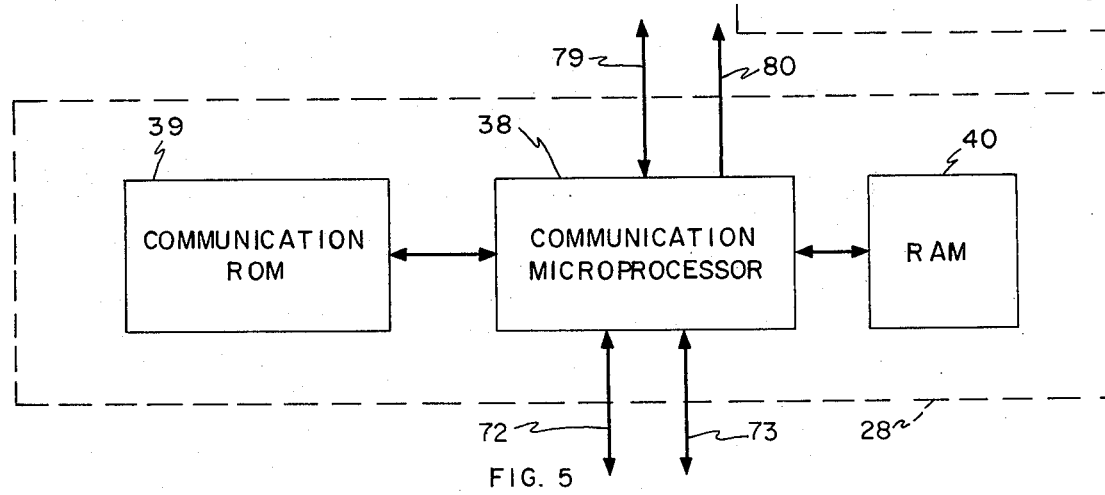
FIG. 5 shows in block diagram form the communication subsystem of FIG. 2, which subsystem includes a communication microprocessor.
Figure 6:
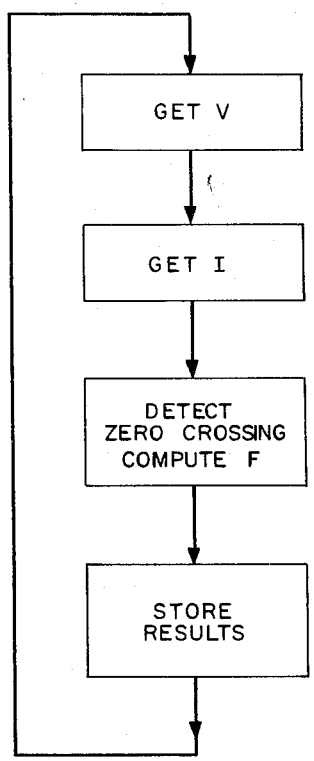
FIG. 6 is a flow chart for controlling the control microprocessor of FIG. 3.

The logic 12, as shown in FIG. 2, includes three subsystems: an instrumentation subsystem 24, a computation subsystem 26 and a communication subsystem 28. The logic 12 further includes interface devices 25 and 27. The subsystems 24, 26 and 28 are shown in greater detail in FIGS. 3, 4 and 5, respectively.

The instrumentation subsystem 24 determines the line voltage as measured by the voltmeter 20 whose output is processed by the multiplexor 22 and the A/D converter 23; the subsystem 24 in the same way determines the line current on the basis of signals from the ammeter 21. The subsystem 24 further establishes the period of the line voltage and hence its frequency. The line voltage and current are sampled a large number of times per cycle. The period (i.e., the reciprocal of frequency) of the electric input is provided once each cycle. That period, as later discussed, may be a factor in pricing of electric energy used by a customer. The system frequency as measured can be communicated to the customer i.e., the block 2 in FIG. 1, by the interface 7 to permit the customer to adjust his load on the basis of system frequency; it also permits testing of the customer's load control mechanism. The voltage and current are combined to provide customer load real reactive power. The foregoing analysis is accomplished by a control microprocessor 31 in FIG. 3 which controls the three data acquisition tasks as well as data transfer to the numerical processing subsystem 26. The processor 31 is programmed in accordance with an algorithm developed to provide the functions of the flow chart in FIG. 5 by a program contained in a read-only memory (ROM) 30. A RAM 32 (i.e, a random access memory) serves as a memory for temporary data storage and measurement buffering.

The current measuring circuit, or ammeter, 21 detects voltage across a calibrated shunting conductor, amplifies the detected voltage under the control of the microprocessor 31, and filters are amplified signal by a lowpass filter with a cutoff frequency less than one-half the sampling rate. The processed analog signal is connected to the multiplexor 22, then to the A/D converter and then to the processor 31.

The voltage measuring circuit or voltmeter 20 detects the line voltage; it contains a variable gain amplifier which, under the control of the processor 31, amplifies the detected voltage. The voltage signal is also lowpass filtered to remove noise. The inherent delay time of the voltage signal thus generated is adjusted to be the same as the inherent delay time of the electric-current signal. The voltage signal is applied to the multiplexor 22 and digitally encoded by the A/D converter 23. The microprocessor 31, as above indicated, notes zero crossings of the voltage signal; from those zero crossings it calculates the period of a cycle or half-cycle and from the period it derives the system frequency, any changes therein and the sign of deviation of said changes. The The multiplexor 22, under the control of the processor 31, permits selection of data acquisition.

The data representing the measurement values are transferred to a computation microprocessor 34 in the subsystem 26 through the interface device 25 which permits asynchronous interaction between the processor 34 and the processor 31. Data are fed into the interface device 25 in FIG. 2 by the control microprocessor 31 when it is ready and it is removed therefrom by the computation microprocessor 34 in FIG. 4 when the latter is prepared to utilize it. If the device 25 is full, the processor 31 temporarily stores new measurements in the RAM 32. The device 25 also provides an interrupt to the computation microprocessor 34 for a service request. The device 25 eliminates interaction and access contention problems that might otherwise exist between the processors 31 and 34.

Figure 7:
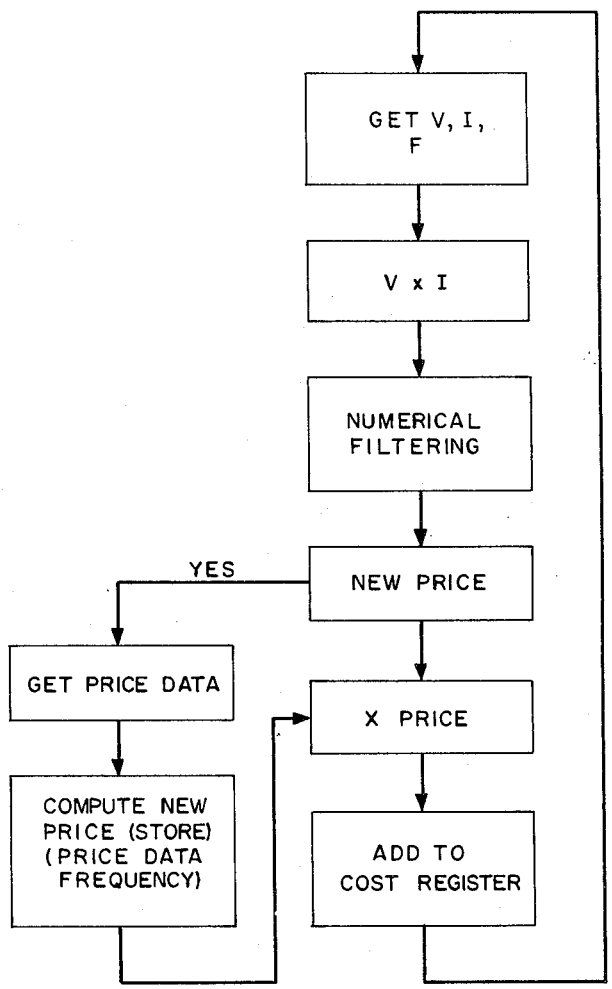
FIG. 7 is a flow chart for controlling the computation microprocessor of FIG. 4.

The subsystem 26 consists of the microprocessor 34, a computation program ROM 33, the RAM 35, a clock 36, and an interrupt controller 37. The RAM 35 consists of a block of high speed volatile memory and a block of nonvolatile memory; it contains a summer which receives input values of electric power usage for discrete time intervals and it integrates those values to determine customer charges. The processor 34 implements the singular feature of the DRIDM 5, its dynamic energy charge rate structure. The cost to the customer of the energy consumed between successive measurement samples is equal to the product of the energy and the cost per unit energy at that time, i.e., the charge rate. The charge rate may be linear or non-linear. The charge rate is a function power system conditions, of time, frequency, reactance (or power factor), demand and spot price data. The specific rate function of these variables is implemented by the processor 34 under the direction of software in the ROM 33. FIG. 7 shows a flow chart of the software for the ROM 33.

An additional parameter in the rate determination algorithm is an optional customer priority coefficient for interruptible load environments such as distributed shedding or microshedding.

The processor 34 filters data digitally and corrects for offset in the analog circuits (i.e., the meters 20 and 21) to attain greater accuracy. Instantaneous demand power and reactance are calculated by the processor 34. The subsystem 26 stores accrued energy and cost information in the nonvolatile memory of the RAM 35. That stored information is available to the communication microprocessor shown at 38 in FIG. 5 through a direct memory access port, which permits spot pricing data to be introduced to the subsystem 24 and permits, as well, processed results to be transferred out of the DRIDM 5.

Figure 8:
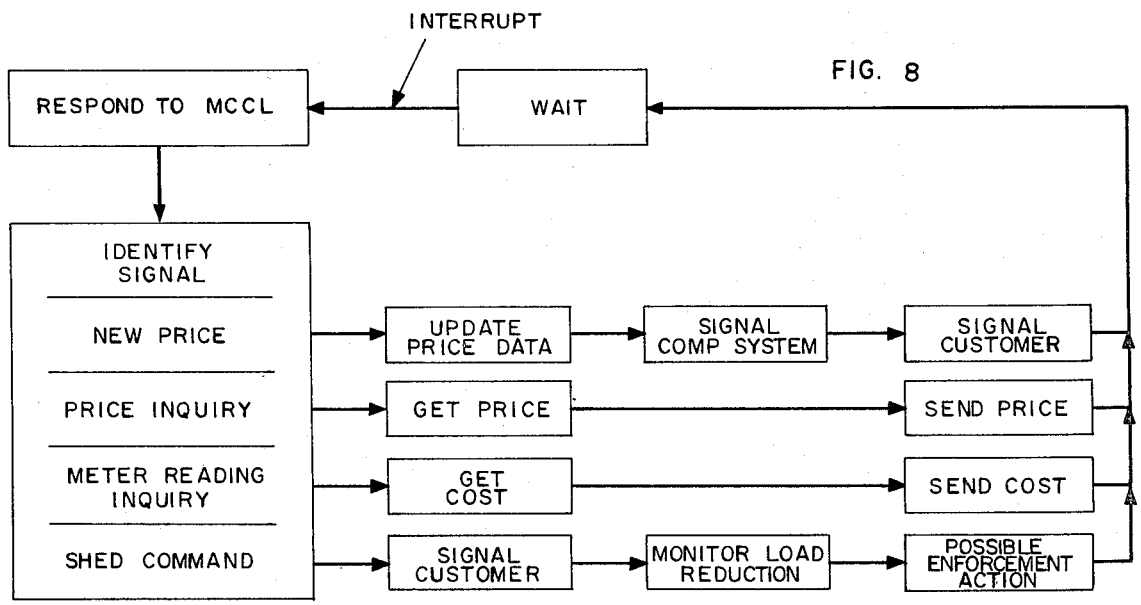
FIG. 8 is a flow chart for controlling the communication microprocessor of FIG. 5.

The communication subsystem 28 contains the processor 38, a dedicated communication ROM 39 (programmed in accordance with the flow chart of FIG. 8) and a RAM 40. The RAM 40 is used for temporary data storage and as a communication buffer. A signal in line 80 in FIGS. 2 and 4 can be used to cause a circuit breaker 45 to accept or shed customer load. Data between the customer and the DRIDM 5 pass along conductors represented by the data link 74 in FIG. 1. The data typically contain instantaneous rate and demand information for the ERAC 11 in FIG. 1; the ERAC 11 ordinarily will contain registers which are continually updated with such information. Communications to the power company are along the data links 71 and 70 in FIG. 1. Intercourse carried by the data links 70, 71 and 74 either originate or terminate in the communication processor 38. The MCCL interface 6 and the BDL interface 7 handle the protocol required for intercourse respectively between the processor 38 and the power company and the customer.

Further modifications of the invention herein disclosed will occur to persons skilled in the art and all such modifications are deemed to be within the scope of the invention as defined by the appended claims.

What is claimed is:

1. A dynamic rate integrating demand monitor that comprises, in combination:
   means for repeatedly measuring electric power to a customer load at successive time duration intervals short compared to the time interval during which power supply load conditions change so as to create an imbalanced supply system;
   means for accepting electrical communication of time-varying price determining data from a power utility to be used to determine a time-varying charge rate applied to the electric power measured at each duration interval of time;
   means to multiply the power at each duration interval of time with the charge rate at the corresponding duration interval of time to produce an incremental expenditure rate for energy used; and
   means to integrate said sequence of incremental expenditure rates to determine a customer charge.

2. A dynamic rate integrating demand monitor as claimed in claim 1 in which the means for measuring electric power measures such electric power at discrete time intervals and in which the means to integrate is a summer.

3. A dynamic rate integrating demand monitor as claimed in claim 1 having means to measure deviation of power frequency to the customer load from nominal system frequency and to modify said charge rate on the basis of the magnitude and sign of the deviation.

4. A dynamic rate integrating demand monitor as claimed in claim 3 having a data interface to permit communication of instant price information and measured system frequency over electrical lines to a customer's load controller.

5. A dynamic rate integrating demand monitor as claimed in claim 4 having in addition,
   means for transmitting a test signal corresponding to measured system frequency, and
   means for testing the level of customer load in response to the test signal by measuring the customer load level.

6. A dynamic rate integrating monitor as claimed in claim 1 having means to measure the power factor of the customer load to permit modification of the charge rate according to a predetermined function.

7. A dynamic rate integrating demand monitor as claimed in claim 1 having means to relate the charge rate to demand according to a non-linear function.

8. A dynamic rate integrating demand monitor as claimed in claim 1 having a data interface to permit communication of instant price information and measured system frequency over electrical lines to a customer's load controller.

9. A dynamic rate integrating demand monitor that comprises, in interconnected combination: instrument means for determining electric power delivered to a load in successive predetermined time intervals during which the delivered electric power cost does not ordinarily change, said time intervals being short compared to the time period during which power supply load conditions change so as to create an imbalanced supply condition, and to develop a power signal therefrom; and
   computation means connected to receive as input thereto the power signal indicative of the electric power delivered for the predetermined time interval and adapted to receive electrical data signals from the power supply system representing a time-varying charge-rate signal which can change energy cost from interval to interval,
   said computation means being operable to combine the power signal and the time-varying charge-rate signal and operable to develop a customer charge for the electric power delivered to the load during the predetermined time interval.

* * * * *